United States Patent [19]

Cook

[11] 4,303,463
[45] Dec. 1, 1981

[54] METHOD OF PEELING THIN FILMS USING DIRECTIONAL HEAT FLOW

[76] Inventor: Melvin S. Cook, 43 Westerly Rd., Saddle River, N.J. 07458

[21] Appl. No.: 192,063

[22] Filed: Sep. 29, 1980

[51] Int. Cl.³ .............................................. C30B 1/06
[52] U.S. Cl. ........................... 156/603; 156/DIG. 88
[58] Field of Search ............... 156/DIG. 88, 600, 624, 156/613, DIG. 73, 603; 427/86; 264/81; 148/171

[56] References Cited

U.S. PATENT DOCUMENTS

| | | | |
|---|---|---|---|
| 3,585,088 | 6/1971 | Schwuttke et al. | 148/174 |
| 3,993,533 | 11/1976 | Milnes et al. | 156/624 |
| 4,027,053 | 5/1977 | Lesk | 427/53 |
| 4,116,751 | 9/1978 | Zaromb | 156/600 |

Primary Examiner—Hiram Bernstein
Attorney, Agent, or Firm—Gottlieb, Rackman & Reisman

[57] ABSTRACT

A method is disclosed for peeling thin layers of crystal from the substrates on which they have been grown. A thin layer of single-crystal material is grown on a single-crystal substrate having a lower melting point temperature than the layer. The layer and substrate are then brought to the melting point temperature of the substrate material, and the layer is contacted to a hot object so that heat flows through the layer to the substrate for liquifying the substrate material contiguous to the layer. The layer is peeled from the substrate where such liquification has occurred.

3 Claims, 2 Drawing Figures

METHOD OF PEELING THIN FILMS USING DIRECTIONAL HEAT FLOW

This invention relates to a low-cost method of producing thin films using directional heat flow to peel the films from substrates on which they have been grown. It can be used, for example, to produce thin single-crystal films of semiconductors for use in solar cells and in the making of semiconductor integrated circuits.

In my co-pending application entitled "METHOD OF PRODUCING THIN SINGLE-CRYSTAL SHEETS", Ser. No. 127,114, filed on Mar. 4, 1980, which application is hereby incorporated by reference, a method is disclosed for producing thin sheets of crystal; in my co-pending application entitled "METHOD OF PRODUCING THIN SINGLE-CRYSTAL SEMICONDUCTOR SHEETS WITH P-N JUNCTIONS", Ser. No. 146,104, filed on May 2, 1980, which application is hereby incorporated by reference, a method is disclosed for producing thin semiconductor crystals with surface p-n junctions formed on them; and in my co-pending application entitled "METHOD OF PRODUCING SINGLE-CRYSTAL SEMICONDUCTOR FILMS", Ser. No. 156,879, filed on June 6, 1980, which application is hereby incorporated by reference, a method is disclosed for producing thin crystals.

These co-pending applications describe the prior art and offer low-cost solutions to certain problems of that art. The methods disclosed in these co-pending applications, however, require use of radiation as an energy source to accomplish the heating required to effect separation of a layer from the substrate on which it has been formed, and it may not always be most convenient to utilize radiation for this purpose.

It is an object of my invention to provide a low-cost method of peeling thin films from substrates on which they have been formed.

It is a further object of my invention to provide a low-cost method of producing thin films of crystal with electrically conductive surfaces.

Briefly, in accordance with the principles of my invention and in the preferred embodiment thereof, a thin (e.g., a five micrometer thick) layer of single-crystal material is grown on a single-crystal substrate composed of material having a lower melting point temperature than that of the layer material. In a particular example, the layer may be composed of gallium arsenide and the substrate may be composed of germanium. Techniques for such growth are well-known in the art and include, for example, chemical vapor deposition, liquid phase epitaxy, and molecular beam epitaxy.

The substrate and the layer are heated to or near (just below) the melting point temperature of the substrate material. Heat is then added to the substrate through the layer, for example, by contacting the layer to a hot object. Heat added to the layer will tend to raise its temperature. Since the layer is in intimate contact with the substrate, at least part of any heat added to the layer will flow through to the substrate.

Since the substrate material is at or near its melting point temperature, any heat added to the substrate will tend to cause liquification of substrate material. Heat flowing in the direction through the layer to the substrate, therefore, will cause liquification of substrate material at the interface of the layer and the substrate. Such a change in state from solid to liquid allows the layer to be locally removed (peeled) from the substrate.

The flow of heat is directional and, if it went through the substrate towards the interface of the layer and the substrate, the substrate structural integrity would be lost before the layer could be peeled. However, because the heat flows from the layer to the substrate in the preferred embodiment, the film may be peeled from the substrate as the heat added liquifies only a shallow depth of substrate material adjacent the interface.

On the other hand, if the heat flow is not unidirectional (for example, if the substrate and layer are heated in an oven), then additional substrate material would be liquified, which is undesirable as it compromises the ability to use the substrate again in producing additional films and can also lead to excessive contamination of the product film by material emanating from the substrate. Of course, if the final-product layer is formed on another, intermediate thin layer of lower melting point temperature substrate material, itself laid down on substrate material of higher melting point temperature material than the material of the intermediate thin layer, then heating the entire structure would melt the intermediate layer and allow the film to be peeled. However, such an approach requires additional system complexity, and thus adds to the cost of the product. In addition, it leads to greater product contamination, and thus lowers its desirability.

If the layer is grown as n-type or p-type semiconductor material, and if the substrate adjacent to the layer includes material which, if incorporated in the layer material, would render it p-type or n-type, respectively, then the liquid formed as a result of heat input during the separation process can introduce material to the separated film which gives rise to a surface p-n junction in the separated film, as described in my co-pending application entitled "METHOD OF PRODUCING THIN SINGLE-CRYSTAL SEMICONDUCTOR SHEETS WITH P-N JUNCTIONS".

If the film is to be used in manufacturing a product where a back electrical contact is required, as in a solar cell, for example, then material added to the layer from the liquified material can render the film region which was adjacent to the substrate before separation electrically conductive. Such an electrically conductive surface can function as a back electrical contact, for example, in the final product made using the separated film.

An advantage of my method is that the substrate is reuseable, with successive layers being formed on it, if desired, until it is consumed beyond the point of useability.

Further objects, features, and advantages of my invention will become apparent upon consideration of the following detailed description in conjunction with the drawing, in which.

Figure 1:
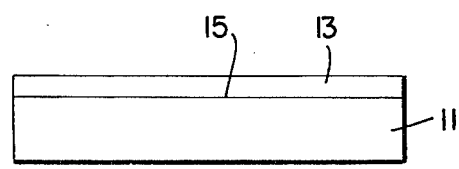
FIG. 1 is a schematic representation of a layer formed on a substrate.

In FIG. 1, substrate 11 is shown with layer 13 formed on it. The layer and the substrate meet at interface 15. The material of the layer and the material of the substrate differ in their melting point temperatures at the interface.

Possible combinations of layer and substrate materials include, for example, germanium and gallium arsenide, silicon and silicon-germanium alloys, and gallium arsenide and gallium aluminum arsenide.

If a single-crystal film is the product desired, then the substrate on which the layer is formed should be single-crystal and have the same lattice arrangement and constants, as is well-known in the art. In addition, it is desirable that the surface on which the layer is formed be defect-free if a defect-free product is preferred. The layer may be formed by any of the means well-known in the art, e.g. liquid phase epitaxy or chemical vapor deposition. It is preferable that the material with the lowest melting point temperature of the structure including the substrate and the layer be located at the interface of the two as it is this material which will be liquified in order to peel the layer from the substrate. However, due to the use of directional heat flow in the method of the invention, this does not mean that the interface material to be liquified must have a lower melting point temperature than the remainder of the layer or the substrate of which it is part.

Separation of the layer from the substrate along the interface is effected in the present invention by developing liquified material along the interface. This is accomplished by adding heat to the material to be liquified after it has reached its melting point temperature. In my co-pending applications, such heat is derived from the absorption of radiation. However, the heat may be added by other means as long as the structural integrity (as a solid) of the remainder of the layer and substrate material is maintained. For example, the heat may be added by contacting the layer or the substrate to a hot object. If the layer to be peeled has a higher melting point temperature than the material to be liquified, the heat may be added through the layer. If the substrate has a higher melting point temperature than the material to be liquified, than the heat may be added directionally through the substrate.

The structure including the layer and the substrate is preferably brought to or near (just below) the melting point temperature of the material to be liquified, although this is not essential. Heat is then added directionally to the material to be liquified through whichever of the layer or the substrate has a higher melting point temperature than the material. For example, in a particular case the layer may be gallium arsenide and the substrate may be germanium. As gallium arsenide has a higher melting point temperature than germanium, the heat added to achieve liquification at the interface is added to the layer. At least part of this heat will flow through the layer to the germanium at the interface. If this germanium at the interface is at its melting point temperature, addition of more heat will cause liquification to develop along the interface. Where such liquification has appeared, the layer may be peeled from the substrate. In this particular case, had the heat been added through the substrate, melting would have occurred at the region of heat entry rather than at the interface.

Clearly, material with a melting point temperature equal to or less than the interface material to be liquified must not lie between the region of entry of such heat and the interface material to be liquified. On the other hand, material may be present on the opposite side of the interface from the region of heat entry (to achieve liquification) which has the same (or lower if a temperature gradient exists) melting point temperature than the interface material to be liquified.

Figure 2:
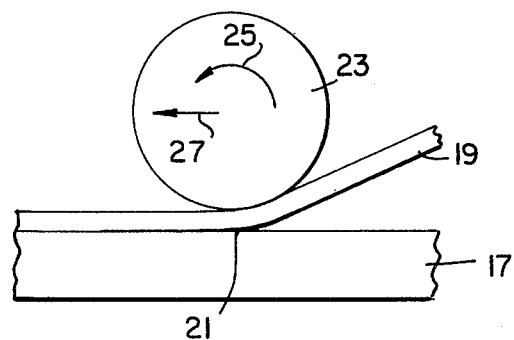
FIG. 2 is a schematic representation of a layer being separated from a substrate by contacting the layer to a heat source.

In FIG. 2, layer 19 is shown being separated from substrate 17 along interface 21. The layer in FIG. 2 has a higher melting point temperature than does the substrate. Therefore, the heat added to achieve liquification of material at the interface is added through the layer by contacting the layer to a heated wheel 23. The method used to heat the wheel is not shown, but any of conventional means may be employed for this purpose. Preferably (although not necessarily), the layer and the substrate have been heated to or near (just below) the melting point temperature of the material to be liquified. This may be done, for example, in an oven. The oven is not shown, but any of conventional ovens may be used for this purpose. It is preferable that the temperature of the wheel be less than the melting point temperature of the layer material it contacts.

At least part of the heat added to the layer from the wheel will travel in the direction of the substrate through the layer, and will reach the material to be liquified. When this material has reached its melting point temperature, the absorption of more heat will result in some liquification. The amount of material liquified after it has reached its melting point temperature is proportional to the additional heat absorbed. Such liquification allows the layer to be peeled from the substrate where it has occurred.

As the wheel rotates in angular direction 25 and translates in linear direction 27, the layer can be progressively peeled from the substrate. The means employed for rotating and translating the wheel, and for peeling the layer from the substrate, are not shown but any of conventional means may be employed for these purposes.

Contact of the layer being peeled with material liquified during the separation process provides an opportunity to add material to the separated film on the surface contacting this liquified material. If an electrically conductive surface is desired, the material added must render the surface electrically conductive. For example, for a gallium arsenide film separated from a germanium substrate, if the germanium incorporates a sufficient percentage of material which, when added to gallium arsenide renders it electrically conductive—zinc being an example of such a material—then the separated film will have an electrically conductive surface. If a surface p-n junction is desired in the separated film, then if the layer is grown as p- or n-type material and the substrate contains material which, when added to the layer in sufficient quantity, renders it n- or p-type, respectively, then if such material is present in sufficient quantity in the substrate, contact with the liquid formed during the separation process will result in the formation of a p-n junction in the film product. Such impurities are well-known in the art.

Although the invention has been described with reference to particular embodiments, it is to be understood that these embodiments are merely illustrative of the application of the principles of the invention. Numerous modifications may be made therein and other arrangements may be devised without departing from the spirit and scope of the invention.

What I claim is:

1. A method of producing films of crystal comprising the steps of epitaxially growing a solid layer of crystal on a solid substrate, the material adjoining the interface of said layer of crystal and said substrate of one of said layer of crystal and said substrate having a melting point temperature lower than that of the material adjoining said interface of the other of said layer of crystal and said substrate, adding heat to said material adjoining said interface having said lower melting point temperature by contacting said other of said layer of crystal and said substrate to a heat source such that material adjoining said interface having said lower melting point temperature liquifies, the remaining material having said lower melting point temperature remaining in solid form, and separating said layer of crystal from said substrate at said liquified material to form a film of crystal.

2. A method in accordance with claim 1 wherein said liquified material is such that it renders the surface of the separated layer of crystal which contacted said liquified material electrically conductive.

3. A method in accordance with claim 1 wherein the surface of the separated layer of crystal which contacted said liquified material is semiconductor material, and said liquified material is such that it renders said semiconductor material at said surface one of p-type and n-type material.

* * * * *